(12) United States Patent
Termeer

(10) Patent No.: US 10,788,552 B2
(45) Date of Patent: Sep. 29, 2020

(54) METHOD AND CONTROL UNIT FOR OPERATING A GRADIENT COIL DEVICE OF AN MRI SYSTEM OR ANOTHER PERIODICALLY STRESSED DEVICE

(71) Applicant: KONINKLIJKE PHILIPS N.V., Eindhoven (NL)

(72) Inventor: Martijn Krelis Termeer, Poppel (BE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/320,132

(22) PCT Filed: Jul. 28, 2017

(86) PCT No.: PCT/EP2017/069100
§ 371 (c)(1),
(2) Date: Jan. 24, 2019

(87) PCT Pub. No.: WO2018/019972
PCT Pub. Date: Feb. 1, 2018

(65) Prior Publication Data
US 2019/0242960 A1    Aug. 8, 2019

(30) Foreign Application Priority Data

Jul. 28, 2016    (EP) .................................... 16181603

(51) Int. Cl.
*G01R 33/385*    (2006.01)
(52) U.S. Cl.
CPC ....... *G01R 33/3854* (2013.01); *G01R 33/385* (2013.01)

(58) Field of Classification Search
CPC .......................... G01R 33/3854; G01R 33/385
See application file for complete search history.

(56) References Cited

U.S. PATENT DOCUMENTS

| 6,396,272 | B1 | 5/2002 | Dietz et al. |
| 2004/0017195 | A1 | 1/2004 | Kassai et al. |
| 2006/0208736 | A1* | 9/2006 | Nistler ................... A61B 5/055 324/322 |
| 2006/0225433 | A1 | 10/2006 | Jammu et al. |

(Continued)

FOREIGN PATENT DOCUMENTS

WO    2009074918 A1    6/2009

OTHER PUBLICATIONS

Jaap Schijve "Fatigue of Structures" (2nd Edition), Springer Publishers p. 144-145, 2009.

(Continued)

*Primary Examiner* — G. M. A Hyder

(57) ABSTRACT

A control unit (56) operates a gradient coil device of a magnetic resonance imaging system (14). At least one first parameter of the gradient coil device (30) and/or at least one second parameter of the gradient coil device (30) is provided. A damage calculation of an operation of the gradient coil device (30) is performed by use of a mathematical model (66), which model (66) is based on the stress-cycle curve or a modified stress-cycle curve and uses the at least one first parameter (68) and/or the at least one second parameter (70, 72). Second parameters for further operation of said gradient coil device (30) are determined.

17 Claims, 2 Drawing Sheets

(56) References Cited

U.S. PATENT DOCUMENTS

| | | |
|---|---|---|
| 2012/0025827 A1 | 2/2012 | Tralshawala |
| 2012/0191384 A1 | 7/2012 | Kalgren et al. |
| 2013/0225975 A1 | 8/2013 | Harvey |
| 2014/0233708 A1* | 8/2014 | Ishiyama ............ H05G 1/54 378/207 |
| 2015/0369888 A1 | 12/2015 | Calvert |
| 2015/0369889 A1 | 12/2015 | Grodzki |
| 2016/0327606 A1 | 11/2016 | Van Wieringen |

OTHER PUBLICATIONS

Hunt "Stress and Strain Limits on the Attainable Velocity in Mechanical Systems" JASA 32 (9) p. 1123-1128 (1960).

Yue Liu et al "Remaining Useful Life Prediction of MEMS Sensors Used in Automotive Under Random Vibration Loading" Reliability and Maintainability Symposium 2013 Proceedings Jan. 28, 2013 p. 1-6.

Dave. S. Steinberg, Vibration Analysis for Electronic Equipment 3rd Edition, 2000, John Wiley and Sons Inc. p. 48-49.

\* cited by examiner

METHOD AND CONTROL UNIT FOR OPERATING A GRADIENT COIL DEVICE OF AN MRI SYSTEM OR ANOTHER PERIODICALLY STRESSED DEVICE

CROSS REFERENCE TO RELATED APPLICATIONS

This application is a U.S. national phase application of International Application No. PCT/EP2017/069100, filed on Jul. 28, 2016, which claims the benefit of EP Application Serial No. 16181603.8 filed on Jul. 28, 2016 and is incorporated herein by reference.

FIELD OF THE INVENTION

The invention relates to a method for operating a gradient coil device of a magnetic resonance imaging system The invention further relates to a corresponding control unit for operating a gradient coil device of a magnetic resonance imaging system and a corresponding magnetic resonance imaging system comprising a gradient coil device and a control unit.

BACKGROUND OF THE INVENTION

Document US 2015/0369888 A1 describes a method for operating a gradient coil device of a magnetic resonance imaging system including a modelling of vibrations of the gradient coil device with the aim to reduce acoustic noise during operation of said device.

Gradient coil devices of MRI systems (MRI: Magnetic Resonance Imaging) always have mechanical resonance frequencies in the MR relevant frequency bands. The corresponding mode shapes are excited by the gradient coils and the response is amplified. This can lead to failure by mechanical fatigue. This is known and mechanisms to avoid this are circumventing or reducing the excitation amplitude of the specific resonance frequencies of the MR scans. Further, an approach predict failure of gradient amplifies for magnetic resonance examination system is known from the international application WO2015/101556. This known approach relies on extracting fingerprints that are indicative for future failure by way of a neural network analysis and applies to gradient amplifier performance.

SUMMARY OF THE INVENTION

It is an object of the invention to provide (a) a method for operating a gradient coil device or other periodically stressed device, (b) a corresponding control unit (c) a corresponding MRI system for operating this device as well as (d) a corresponding computer program product to overcome the aforementioned challenges.

This object is achieved by the features of the independent claims. The dependent claims detail advantageous embodiments of the invention.

According to various embodiments of the invention the operating method comprises the following steps: (a) providing at least one first parameter of the device and/or at least one second parameter of the device; (b) performing damage calculation of an operation of said device by use of a mathematical model, which model is based on stress-cycle curves (S-N curves, also known as a Wöhler curves) or modified stress-cycle curves and uses the at least one first parameter and/or the at least one second parameter; and (c) determining second parameters for further operation of said device. In general, the gradient coil device can be a single gradient coil or a set of (x-, y-, z-) gradient coils as used in nearly all MR systems.

Material fatigue/mechanical fatigues are well characterised by the Wöhler curves or S-N curves. The S-N diagrams plot nominal stress amplitude S versus cycles to failure N. Part of the S-N curves show an approximate linear relation on log-log scale with slope $-1/b$, the Basquin relation (see for example document 'Fatigue of Structures and Materials' by Jaap Schijve, $2^{nd}$ Edition 2009, Springer). The parameter b is material dependent. For example for copper fatigue b=6, but for general mechanical fatigue it is assumed here that b=4. In that case the allowable stress S in the power 4 ($S^4$) times the number of positive zero crossings N is constant: $S^4 \cdot N$=constant. This means that the damage potential of a stress (or velocity) at double amplitude is sixteen times as severe in contributing to mechanical fatigue.

Knowledge of material fatigue/mechanical fatigue and the dynamics of the device is built into the model to predict the cumulative damage potential of an operation period of said device. The model can then be used to predict the damage potential of that operation period for the device or it can be used to monitor cumulative damage build-up in such devices. This information can, e.g., be used to optimize MR scan protocols and to predict the necessity of predictive maintenance for gradient coil devices. Notably, known approaches of failure prediction do not assess metal fatigue.

The model uses at least one measured or calculated first parameter of the device based on velocities in the power b (corresponding to the Wöhler curve). According to the document 'F. V. Hunt: "Stress and Strain Limits on the Attainable Velocity in Mechanical Systems", JASA, 32(9) 1123-1128, 1960.' velocity is the property that scales best with mechanical stress as function of frequency. The model can also use a different power than the power 4. For example using a power 2 makes the filters less sharp.

The model also uses at least one second parameter to count the number of positive zero-crossings. This information can be used to optimize MR scan protocols and to predict the necessity of predictive maintenance.

According to a preferred embodiment of the invention the at least one first parameter of the device is a transfer function/a plurality of transfer functions of the device preferably based on velocities in the power b.

According to another preferred embodiment of the invention the at least one second parameter of the device is the effective frequency of a scan protocol (taken from FFTs of the different gradient wave forms) and/or the total scan duration to count the number of positive zero-crossings. This information can be used to optimise MR scan protocols and to predict the necessity of predictive maintenance.

According to yet another preferred embodiment of the invention the damage calculation includes calculating at least one damage factor D. The damage calculation uses S-N curves (or modified S-N curves) to calculate the damage factor (or damage values).

The damage factor D based on the S-N curve preferably is given by the eq.:

$$D = \sum_{x,y,z} t_{scan} \cdot f_{\mathit{eff},x,y,z} \cdot (G_{x,y,z} \cdot [V/G_{x,y,z}])^b,$$

wherein $t_{scan}$ is the scan time of the protocol and $f_{\mathit{eff},x,y,z}$ (short form $f_{\mathit{eff}}$) is the 'effective frequency' of the x, y and z gradient spectra of the scan protocol, $G_{x,y,z}$ are the frequency spectra of the x, y and z gradients of the scan protocol, and $[V/G_{x,y,z}]$ are measured transfer functions as function of frequency of the gradient axes to the gradient coil velocity and $-1/b$ is the slope of the straight approximation of the S-N curve on log-log scale. In connection with these embodiments of the invention the factor b preferably is in the rage of $2 \leq b \leq 6$. For some particular embodiments of the invention the factor b is equal 4 (b=4).

The corresponding damage Factor D of the (gradient coil) device can be calculated before an MR scan protocol is started, or it can be used to analyse scans that have already been executed in the past using log file information for example.

According to yet another preferred embodiment of the invention the method further comprises the step of (d) considering the determined parameters for further operation within the further operation of said device. The consideration of the parameters preferably is an automatic consideration of said parameters.

According to one preferred embodiment of the invention the at least one determined second parameter for further operation is a predicted material condition state of the device with respect to its material fatigue, which parameter limits the unrestricted use of the device after reaching this state.

According to another preferred embodiment of the invention the at least one determined second parameter for further operation is a set of second parameters for keeping a desired material condition state of the device with respect to its material fatigue within a given operating time of said device.

According to various embodiments of the invention the control unit for operating a gradient coil device of a magnetic resonance imaging system (MRI system) (which run into danger of material fatigue failure modes due to the mechanical vibrations) comprises a computer system having a processor device and a memory device, wherein a mathematical model is implemented in the computer system, which mathematical model is based on the stress-cycle curve or a modified stress-cycle curve and designed for performing damage calculation, especially designed for calculating at least one damage factor D, of an operation of the device by use of at least one first parameter and at least one second parameter of the device. The control unit can be used for performing the aforementioned operating method.

According to a preferred embodiment of the control unit according to the invention the at least one first parameter of the device is a transfer function/a plurality of transfer functions of the device.

According to another preferred embodiment of the control unit according to the invention the at least one second parameter of the device is the effective frequency of a scan protocol and/or the total scan duration to count the number of positive zero-crossings.

According to yet another preferred embodiment of the control unit according to the invention the control unit is further set up for determining second parameters for further operation of said device.

According to another preferred embodiment of the control unit according to the invention said control unit further comprises an output interface for an output of the determined second parameters for further operation of said device.

According to various embodiments of the invention, the magnetic resonance imaging system comprises a gradient coil device and an aforementioned control unit.

The invention further relates to a computer program product for executing the aforementioned method on a computer system, which computer system preferably is a computer system of a magnetic resonance imaging system. The approach of the present invention may also be applied to predict cumulative damage due to material fatigue in repetitive stressed devices in the field of magnetic resonance imaging other than the gradient coil. Examples may be the radio frequency (RF) body coil or a posterior RF coil array and their mountings to the system's support structure.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
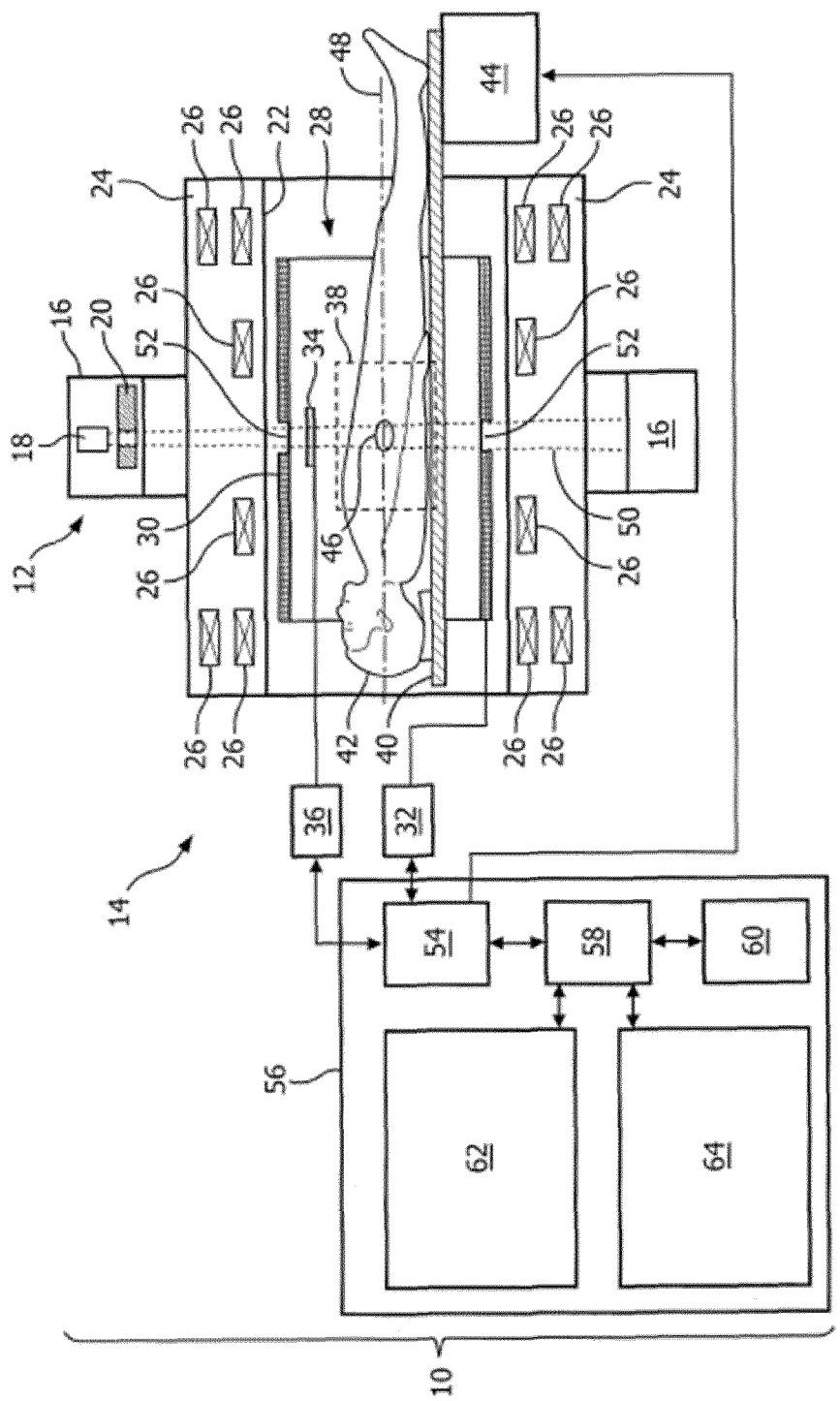
FIG. 1 shows an MR-guided radiation therapy system with an MR imaging system according to a preferred embodiment of the invention.

FIG. 1 shows an embodiment of an MR-guided radiation therapy system 10. The MR-guided radiation therapy system 10 comprises a LINAC 12 and a magnetic resonance imaging system (MRI system) 14 according to the invention. The LINAC 12 comprises a gantry 16 and a X-ray source 18. The gantry 16 is for rotating the X-ray source 18 about an axis of gantry rotation 20. Adjacent to the X-ray source 18 is an adjustable collimator 20. The adjustable collimator 20 may for instance have adjustable plates for adjusting the beam profile of the X-ray source 18. The adjustable collimator 20 may, for example, be a multi-leaf collimator. The magnetic resonance imaging system 14 comprises a magnet 22.

It is also possible to use permanent or resistive magnets. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. The magnet 22 shown in this embodiment is a standard cylindrical superconducting magnet. The magnet 22 has a cryostat 24 with superconducting coils 26 within it. The magnet 22 has a bore 28. Within the bore 28 of the cylindrical magnet 22 there is an imaging zone where the magnetic field is strong and uniform enough to perform magnetic resonance imaging.

Within the bore 28 of the magnet 22 is a magnetic field gradient coil device 30 for acquisition of magnetic resonance data to spatially encode magnetic spins within an imaging zone of the magnet. The magnetic field gradient coil device 30 is connected to a magnetic field gradient coil power supply 32. The magnetic field gradient coil device 30 is intended to be representative, to allow radiation to pass through without being attenuated it will normally be a split-coil design. Typically, magnetic field gradient coils contain three separate sets of coils for spatially encoding in three orthogonal spatial directions. The magnetic field gradient power supply 32 supplies current to the magnetic field gradient coils 30. The current supplied to the magnetic field coils 30 is controlled as a function of time and may be ramped or pulsed.

There is an antenna device 34 connected to a transceiver 36, which device 34 comprises at least one MR imaging antenna, each with a corresponding antenna loop. The device 34 is adjacent to an imaging zone 38 of the magnet 22. The imaging zone 38 has a region of high magnetic field and homogeneity which is sufficient for performing magnetic resonance imaging. The device 34 may be for manipulating the orientations of magnetic spins within the imaging zone and for receiving radio transmissions from spins also within the imaging zone. The antenna device 34 may also be referred to as an antenna or channel. The device 34 is intended to also represent a dedicated transmit antenna and a dedicated receive antenna. Likewise, the transceiver may also represent a separate transmitter and receivers.

Also within the bore 28 of the magnet 22 is a subject support 40 for supporting a subject 42. The subject support 40 may be positioned by a mechanical positioning system 44. Within the subject 42 there is a target zone 46. An axis of gantry rotation 48 is coaxial in this particular embodiment with the cylindrical axis of the magnet 22. The subject support 40 has been positioned such that the target zone 46 lies on the axis 48 of gantry rotation. The X-ray source 18 is shown as generating a radiation beam 50 which passes through the collimator 20 and through the target zone 46. As the radiation source 18 is rotated about the axis 48 the target zone 46 will always be targeted by the radiation beam 50. The radiation beam 50 passes through the cryostat 24 of the magnet. The magnetic field gradient coil device 30 has a gap 52 which separate the magnetic field gradient coil device 30 into two sections. The gap 52 reduced attenuation of the radiation beam 50 by the magnetic field gradient coil device 30. In an alternative embodiment a split or open magnet design is used to reduce the attenuation of the X-ray beam by the magnet 22. The device 34 can be seen as being attached to the inside of the bore of the magnet 22 (not shown).

The transceiver 36, the magnetic field gradient coil power supply 32 and the mechanical positioning system 44 are all shown as being connected to a hardware interface 54 of a computer system of a control unit 56. The computer system of said control unit 56 is shown as further comprising a processor 58 for executing machine executable instructions and for controlling the operation and function of the MR-guided radiation therapy system 10. The hardware interface 54 enables the processor 58 to interact with and control the MR-guided radiation therapy system 10. The processor 58 is shown as further being connected to a user interface 60, computer storage 62, and computer memory 64.

The computer storage 62 contains a treatment plan and an X-ray transmission model of the antenna device 34. The X-ray transmission model may comprise the location of sensitive components of the device 34 and also the X-ray transmission properties of the antenna device 34. The computer storage 62 further contains a pulse sequence. A pulse sequence as used herein is a set of commands used to control various components of the magnetic resonance imaging system 14 to acquire magnetic resonance data. The computer storage 62 contains magnetic resonance data that was acquired using the magnetic resonance imaging system 14.

The computer storage 62 is further shown as containing a magnetic resonance image that was reconstructed from the magnetic resonance data. The computer storage 62 is further shown as containing an image registration of the magnetic resonance image. The image registration registers the location of the image relative to the magnetic resonance imaging system 14 and the LINAC 12. The computer storage 62 is further shown as containing the location of the target zone 46. This was identified in the magnetic resonance image. The computer storage 62 is further shown as containing control signals. The control signals are control signals which are used to control the LINAC 12 to irradiate the target zone 46.

The computer memory 64 is shown as containing a control module. The control module contains computer-executable code which enables the processor 58 to control the operation and function of the medical apparatus 10. For instance, the control module may use the pulse sequence to acquire the magnetic resonance data. The control module may also use the control signals to control the LINAC 12. The computer memory 64 is further shown as containing a treatment plan modification module. The treatment plan modification module modifies the treatment plan using the information contained in the X-ray transmission model. The computer memory 64 is shown as further containing an image reconstruction module. The image reconstruction module contains code which enables the processor 58 to reconstruct the magnetic resonance image from the magnetic resonance data.

The computer memory 64 is shown as further containing an image registration module. The image registration module contains code which enables the processor 58 to generate the image registration in the location of the target zone 46 using the magnetic resonance image. The computer memory 64 is shown as further containing a target zone location module. The target zone location module contains code which enables the processor 58 to generate the location of the target zone 46 using the image registration. The computer memory 64 is further shown as containing a control signal generation module. The control signal generation module contains code which enables the processor 58 to generate the control signals from the treatment plan and the location of the target zone. The treatment plan after it has been modified in accordance with the X-ray transmission module is used.

Figure 2:
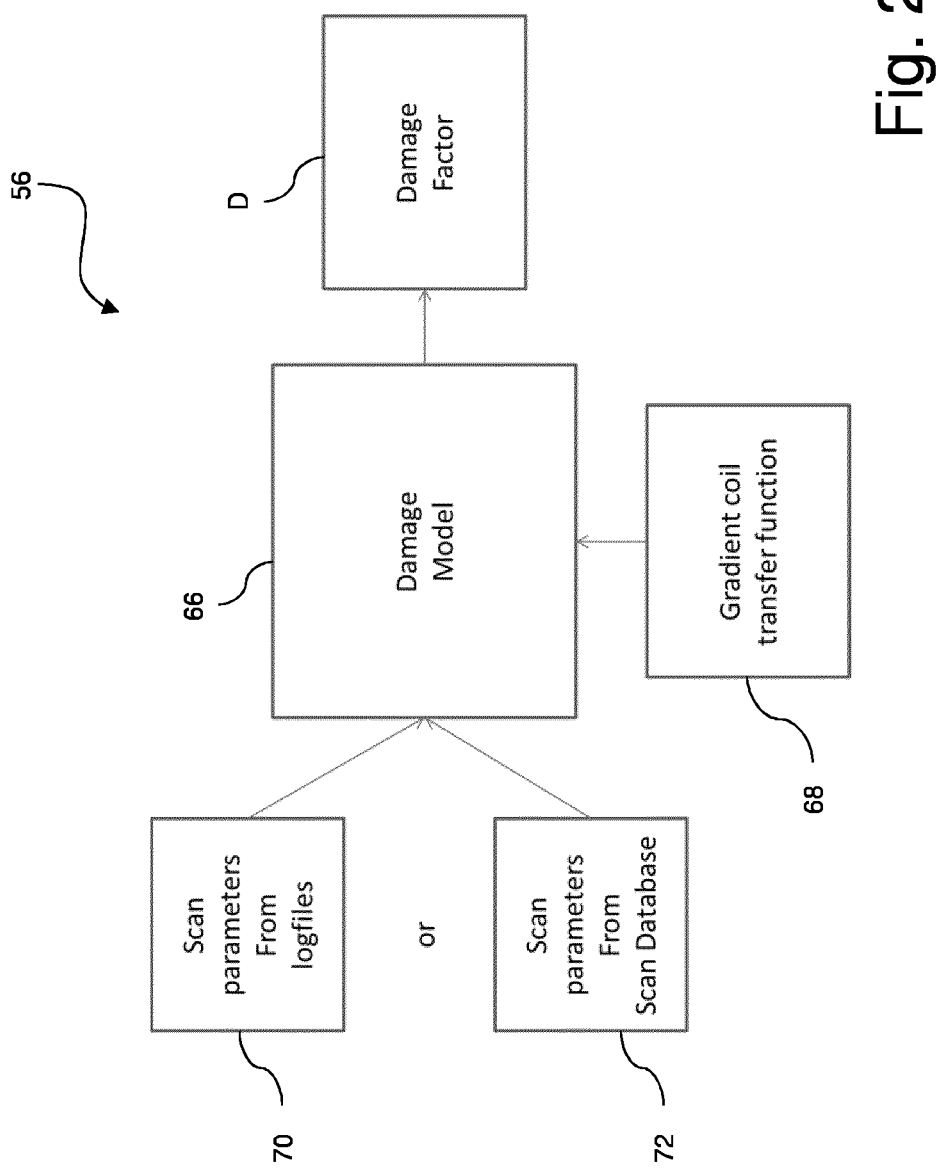
FIG. 2 shows a schematic view of a control unit for operating a gradient coil device of the magnetic resonance imaging system shown in FIG. 1.

FIG. 2 shows a schematic view of the control unit 56 for operating a gradient coil device 30 of the magnetic resonance imaging system 14 shown in FIG. 1. The control unit 56 comprises the computer system having the processor 58 as well as the computer memory 64 and the computer storage 62, wherein a mathematical model 66 is implemented in the computer system of the control unit 56. The mathematical model is based on the known stress-cycle curve (S-N curve, also known as a Wöhler curve) or a modified stress-cycle curve and designed for calculating damage factors D of an operation of the device 30 by use of the at least one first parameter 68 and the at least one second parameter 70, 72 of the device 30; wherein the control unit 56 is further set up for determining second parameters for further operation of said device 30. The damage factor D is $$D = \sum_{x,y,z} t_{scan} \cdot f_{eff,x,y,z} \cdot (G_{x,y,z} \cdot [V/G_{x,y,z}])^b$$

The damage Factor can be calculated before an MR scan protocol is started, or it can be used to analyze scans that already have been executed in the past using log file information for example.

The model 66 uses measured transfer functions 68 of the gradient coil device 30 based on velocities in the power 4. The velocity is the property that scales best with mechanical stress as function of frequency.

General mechanical fatigue S-N curves have a power of 4. This means that the damage potential of a stress (or velocity) at double amplitude is 16 times as severe in contributing to mechanical fatigue.

The model 66 also uses the effective frequency of a scan protocol (taken from FFTs of the different gradient wave forms) 70, 72 and the total scan duration to count the number of positive zero-crossings. This information can be used to optimize MR scan protocols and to predict the necessity of predictive maintenance.

Ways of Implementation or Usage:

Predictive maintenance: Use the model 66 on systems in the installed base to monitor and potential mechanical damage build-up.

Circumvent or minimize damage build-up, increase reliability: Optimize a scan before it is executed, use the model to steer scan parameters such as slew rate, repetition time etc. in a direction that causes less damage to the gradient coil device 30 or the MRI system 14.

Alternatives:

Use a different power than the power 4 (known from the Wöhler curves of the materials used). For example a modified stress-cycle curve using a power 2, which makes the filters less sharp or a power 6 for pure copper, with sharper filters.

Use a different power than the power 4 (known from the Wöhler curves). For example a power 2 provides a good measure to reduce acoustic noise radiation. The far field radiated acoustic power of a body in general scales with the surface averaged velocity in the power 2.

Introduce peak widening to incorporate variation in resonance frequencies. Typically +/−2.5% widening of peaks is enough.

Use calculated transfer functions based on stresses instead of measured velocities.

Apply this approach to other devices than a gradient coil device 30 which can have fatigue failure modes due to mechanical vibrations (other repetitive stressed devices).

Leave out the scan duration and effective frequency in the model 66. In this way no cumulative damage potential over multiple scans can be calculated, but a single scan can be optimized for damage potential or can be forbidden to be executed because the potential for damage is too large in the long run.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for operating a gradient coil device of a magnetic resonance imaging system or another component of a magnetic resonance imaging system that is subject to repetitive mechanical stress, the method comprising:
   providing at least one first parameter of the gradient coil device, the at least one parameter being at least one of:
      one or more transfer functions of the gradient coil device,
      an effective frequency $f_{\textit{eff},x,y,z}$ of a scan protocol, and/or a scan duration $t_{scan}$;
   performing a damage calculation of an operation of said gradient coil device by use of a mathematical model, which model is based on a stress-cycle curve or a modified stress-cycle curve and uses the at least one parameter; and
   determining an operation parameter of said gradient coil device so as to (i) predict necessity of predictive maintenance or (ii) adjust the operation parameters in a direction that causes less damage to the gradient coil device.

2. The method according to claim 1, wherein the at least one first parameter of the gradient coil device includes the one or more transfer functions of the gradient coil device.

3. The method according to claim 1, wherein the at least one parameter of the device is at least one of the effective frequency $f_{\textit{eff},x,y,z}$ of a scan protocol and/or the scan duration $t_{scan}$.

4. The method according to claim 1, wherein the damage calculation includes calculating at least one damage factor D.

5. The method according to claim 4, wherein the damage factor D is:

$$D = \sum_{x,y,z} t_{scan} \cdot f_{\textit{eff},x,y,z} \cdot (G_{x,y,z} \cdot [V/G_{x,y,z}])^b.$$

where $f_{\textit{eff},x,y,z}$ is an effective frequency of x, y, and z gradient spectra of the scan protocol, $G_{x,y,z}$ are frequency spectra of x, y, and z gradients of the scan protocol, $[V/G_{x,y,z}]$ are measured transfer functions as functions of the frequency spectra of the gradient axes to gradient coil device velocity, and −1/b is a slope of the straight approximation of the stress-cycle curve on a log-log scale.

6. The method according to claim 1, further comprising: adjusting the operation parameters.

7. The method according to claim 6, wherein the operation parameter is adjusted based on at least one of:
   a predicted material condition state of the gradient coil device with respect to its material fatigue, and/or
   keeping a desired material condition state of the gradient coil device with respect to its material fatigue within a given operating time of said gradient coil device.

8. A non-transitory computer-readable medium carrying software which when executed in a computer processor controls the computer processor to perform the method according to claim 1.

9. A magnetic resonance system comprising:
   a gradient coil device; and
   one or more computer processors configured to perform the method according to claim 1.

10. A control system for operating a gradient coil device of a magnetic resonance imaging system, the control system comprising a computer system including a processor and a computer memory and/or a computer storage, wherein the computer system is configured to implement a mathematical model, which mathematical model is based on a stress-cycle curve or a modified stress-cycle curve and designed for calculating at least one damage factor D, of an operation of the device using at least one of at least one transfer function of the gradient coil device, and an effective frequency $f_{\mathit{eff},x,y,z}$ of a scan protocol and/or the scan duration $t_{\mathit{scan}}$, and based on the damage factor D (i) predict maintenance of the gradient coil device, or (ii) adjust the scan protocol to cause less damage to the gradient coil device.

11. The control system according to claim 10, wherein the damage factor D is calculated using the at least one transfer function and at least one of the effective frequency of a scan protocol and/or the scan duration and/or a number of positive zero-crossings.

12. The control system according to claim 10, further including an interface for outputting the adjusted scan protocol for further operation of said gradient coil device.

13. A magnetic resonance imaging system comprising a gradient coil device and a control system according to claim 10.

14. A magnetic resonance system comprising:
  a gradient coil configured to generate magnetic field gradient pulses in an examination region;
  one or more computer processors configured to:
    control the magnetic resonance system to implement selectable scan protocols, the scan protocols controlling the gradient coil to generate the magnetic field pulses, the generating of the gradient magnetic field pulses causing material fatigue and/or mechanical fatigue,
    input at least one transfer function for the gradient coil and a parameter based on the implemented scan protocols including at least one of effective frequencies of the implemented scan protocols, durations of the implemented scan protocols, and gradient pulse cycles into a mathematical model based on a stress-cycle curve to at least one of:
      predict cycles until failure or maintenance of the gradient coil, or
      adjust the scan protocols to cause less damage to the gradient coil.

15. The magnetic resonance system according to claim 14, wherein the mathematical model outputs a damage factor D and the damage factor is used to at least one of predict the cycles until failure or maintenance of the gradient coil, or adjust the scan protocols to cause less damage to the gradient coil.

16. The magnetic resonance system according to claim 15, wherein the damage factor D is
  where $t_{\mathit{scan}}$ is a total scan duration, $f_{\mathit{eff},x,y,z}$ is an effective frequency of x, y, and z gradient spectra of the scan protocol, $G_{x,y,z}$ are frequency spectra of x, y, and z gradients of the scan protocol, $[V/G_{x,y,z}]$ are measured transfer functions as functions of the frequency spectra of the gradient axes to gradient coil device velocity, and $-1/b$ is the slope of the straight approximation of the stress-cycle curve on a log-log scale.

17. The magnetic resonance system according to claim 14, wherein the stress-cycle curve includes a Wöhler curve.

* * * * *